(12) United States Patent
Wang et al.

(10) Patent No.: US 12,322,339 B2
(45) Date of Patent: Jun. 3, 2025

(54) DISPLAY PANEL

(71) Applicants: Chengdu BOE Optoelectronics Technology Co., Ltd., Sichuan (CN); BOE Technology Group Co., Ltd., Beijing (CN)

(72) Inventors: Linlin Wang, Beijing (CN); Xilei Cao, Beijing (CN); Benlian Wang, Beijing (CN); Weiyun Huang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/465,204

(22) Filed: Sep. 12, 2023

(65) Prior Publication Data

US 2024/0005864 A1  Jan. 4, 2024

Related U.S. Application Data

(63) Continuation of application No. 17/299,078, filed as application No. PCT/CN2020/119453 on Sep. 30, 2020, now Pat. No. 11,790,845.

(51) Int. Cl.
*G09G 3/3233* (2016.01)
*G09G 3/3266* (2016.01)
(Continued)

(52) U.S. Cl.
CPC ......... *G09G 3/3233* (2013.01); *G09G 3/3266* (2013.01); *G09G 2300/0408* (2013.01);
(Continued)

(58) Field of Classification Search
CPC ............... G09G 3/3233; G09G 3/3266; G09G 2300/0408; G09G 2300/0426;
(Continued)

(56) References Cited

U.S. PATENT DOCUMENTS 11,790,845 B2 * 10/2023 Wang .................. G09G 3/3233
345/214
2008/0224970 A1 * 9/2008 Van Den Biggelaar ....................
G09G 3/348
345/55

(Continued)

FOREIGN PATENT DOCUMENTS

CN   101630481 A   1/2010
CN   204680360 A   9/2015
(Continued)

*Primary Examiner* — Lixi C Simpson
(74) *Attorney, Agent, or Firm* — ArentFox Schiff LLP; Michael Fainberg

(57) ABSTRACT

A display panel includes a pixel circuit. The pixel circuit includes a write-in compensation module for writing data signal(s) into a light emission device through a driving transistor and compensating a threshold voltage of the driving transistor; a first reset module for providing a signal of a first reset signal end to a gate of the driving transistor under control of a first reset control end; a second reset module for providing a signal of a second reset signal end to an anode of the light emission device under control of a second reset control end; and a light emission control module for connecting a drain electrode of the driving transistor with the anode under control of a light emission control end. A cathode of the light emission device is connected with a first power source voltage end.

18 Claims, 13 Drawing Sheets

(51) Int. Cl.
*H10K 59/121* (2023.01)
*H10K 59/122* (2023.01)
*H10K 59/131* (2023.01)

(52) U.S. Cl.
CPC .............. *G09G 2300/0426* (2013.01); *G09G 2300/043* (2013.01); *G09G 2300/0819* (2013.01); *G09G 2300/0842* (2013.01); *G09G 2310/0281* (2013.01); *G09G 2310/08* (2013.01); *G09G 2320/0247* (2013.01); *G09G 2320/043* (2013.01); *H10K 59/1213* (2023.02); *H10K 59/122* (2023.02); *H10K 59/131* (2023.02)

(58) Field of Classification Search
CPC ..... G09G 2300/043; G09G 2300/0819; G09G 2300/0842; G09G 2310/08; G09G 2320/0247; G09G 2320/043; H10K 59/131; H10K 59/122; H10K 59/1213
See application file for complete search history.

(56) References Cited

U.S. PATENT DOCUMENTS

| | | | |
|---|---|---|---|
| 2010/0013816 A1 | 1/2010 | Kwak | |
| 2016/0071461 A1 | 3/2016 | Lee et al. | |
| 2017/0116922 A1 | 4/2017 | Jung et al. | |
| 2017/0193901 A1 | 7/2017 | Wang et al. | |
| 2017/0365218 A1 | 12/2017 | Jeong et al. | |
| 2018/0061324 A1 | 3/2018 | Kim et al. | |
| 2018/0336830 A1 | 11/2018 | Wang et al. | |
| 2019/0114966 A1 | 4/2019 | Park et al. | |
| 2019/0221165 A1 | 7/2019 | Park et al. | |
| 2019/0279589 A1* | 9/2019 | Kusumi | G09G 3/3677 |
| 2019/0304367 A1 | 10/2019 | Li et al. | |
| 2019/0326381 A1* | 10/2019 | Hou | G09G 3/3233 |
| 2020/0044009 A1 | 2/2020 | Kwak et al. | |
| 2020/0051491 A1 | 2/2020 | Xuan et al. | |
| 2021/0304678 A1* | 9/2021 | Wang | H10K 59/131 |
| 2022/0335894 A1* | 10/2022 | Zhou | G09G 3/3266 |

FOREIGN PATENT DOCUMENTS

| | | |
|---|---|---|
| CN | 105427806 A | 3/2016 |
| CN | 106527002 A | 3/2017 |
| CN | 106782329 A | 5/2017 |
| CN | 107068066 A | 8/2017 |
| CN | 107527591 A | 12/2017 |
| CN | 107610640 A | 1/2018 |
| CN | 107767817 A | 3/2018 |
| CN | 108364982 A | 8/2018 |
| CN | 108492782 A | 9/2018 |
| CN | 109671395 A | 4/2019 |
| CN | 110047428 A | 7/2019 |
| CN | 110047432 A | 7/2019 |
| CN | 110808265 A | 2/2020 |
| IN | 205920745 U | 2/2017 |

\* cited by examiner

DISPLAY PANEL

This application is a continuation of U.S. patent application Ser. No. 17/299,078, filed on Jun. 2, 2021, which is a National Stage of International Application No. PCT/CN2020/119453, filed on Sep. 30, 2020, the entire contents of which are incorporated herein by reference.

FIELD

The present application relates to the technical field of display, in particular to a display panel.

BACKGROUND

The Organic Light Emitting Diode (OLED) display is one of hotspots in the research field of flat panel displays nowadays. Compared with the liquid crystal display, the OLED display has the advantages of low energy consumption, low production cost, self-light-emission, wide viewing angle, fast response speed and the like. At present, the OLED display has begun to replace the traditional Liquid Crystal Display (LCD) in the field of flat panel displaying such as in mobile phones, PDAs, and digital cameras. Pixel circuit design is the core technical content of the OLED display, which is of important research significance.

Unlike LCD, which uses stable voltage to control brightness, the OLED is current driven and needs stable current to control light emission. Generally, a pixel circuit is usually composed of a driving transistor, a switch transistor and a storage capacitor. When the OLED emits light, because the OLED emits light for a long time, the storage capacitor cannot store potential of a gate of the driving transistor for the long time, and electric leakage of the gate of the driving transistor will cause abnormal display.

SUMMARY

In view of this, embodiments of the present application provide a display panel as follows.

The display panel includes a pixel circuit, a display region and a frame region. The display region includes a plurality of the pixel circuits provided by the embodiments of the present application in matrix arrangement. The pixel circuit includes: a first reset module, a second reset module, a driving transistor, a first light emission control module, a write-in compensation module and a light emission device.

The write-in compensation module is configured to write data signal(s) into the light emission device through the driving transistor and compensate a threshold voltage of the driving transistor.

The first reset module is configured to provide a signal of a first reset signal end to a gate of the driving transistor under control of a first reset control end.

The second reset module is configured to provide a signal of a second reset signal end to an anode of the light emission device under control of a second reset control end.

The first light emission control module is configured to connect a drain electrode of the driving transistor with the anode of the light emission device under control of a first light emission control end.

A cathode of the light emission device is connected to a first power source voltage end.

A potential of the first reset signal end is larger than a potential of the second reset signal end.

Optionally, in the pixel circuit provided by the embodiments of the present application, a potential of the first power source voltage end is the same as the potential of the second reset signal end.

Optionally, in the pixel circuit provided by the embodiments of the present application, the first reset module includes a first switch transistor, a gate of the first switch transistor is connected with the first reset control end, a first electrode of the first switch transistor is connected with the first reset signal end, and a second electrode of the first switch transistor is connected with the gate of the driving transistor.

The second reset module includes a second switch transistor, a gate of the second switch transistor is connected with the second reset control end, a first electrode of the second switch transistor is connected with the second reset signal end, and a second electrode of the second switch transistor is connected with the anode of the light emission device.

The first light emission control module includes a third switch transistor, a gate of the third switch transistor is connected with the first light emission control end, a first electrode of the third switch transistor is connected with the drain electrode of the driving transistor, and a second electrode of the third switch transistor is connected with the anode of the light emission device.

Optionally, in the pixel circuit provided by the embodiments of the present application, the write-in compensation module includes: a fourth switch transistor, a fifth switch transistor, a sixth switch transistor and a first capacitor.

A gate of the fourth switch transistor is connected with a scanning signal end, a first electrode of the fourth switch transistor is connected with the gate of the driving transistor, and a second electrode of the fourth switch transistor is connected with the drain electrode of the driving transistor.

A gate of the fifth switch transistor is connected with the scanning signal end, a first electrode of the fifth switch transistor is connected with a data signal end, and a second electrode of the fifth switch transistor is connected with a source electrode of the driving transistor.

A gate of the sixth switch transistor is connected with the first light emission control end, a first electrode of the sixth switch transistor is connected with the source electrode of the driving transistor, and a second electrode of the sixth switch transistor is connected with a second power source voltage end.

The first capacitor is connected between the second power source voltage end and the gate of the driving transistor.

Optionally, in pixel circuit provided by the embodiments of the application, the write-in compensation module includes: a fourth switch transistor, a fifth switch transistor, a sixth switch transistor and a first capacitor.

A gate of the fourth switch transistor is connected with a scanning signal end, a first electrode of the fourth switch transistor is connected with the gate of the driving transistor, and a second electrode of the fourth switch transistor is connected with a source electrode of the driving transistor.

A gate of the fifth switch transistor is connected with the scanning signal end, a first electrode of the fifth switch transistor is connected with a data signal end, and a second electrode of the fifth switch transistor is connected with the drain electrode of the driving transistor.

A gate of the sixth switch transistor is connected with the first light emission control end, a first electrode of the sixth switch transistor is connected with the source electrode of the driving transistor, and a second electrode of the sixth switch transistor is connected with a second power source voltage end.

The first capacitor is connected between the second power source voltage end and the gate of the driving transistor.

Optionally, in the pixel circuit provided by the embodiments of the present application, the write-in compensation module include: a fourth switch transistor, a fifth switch transistor, a sixth switch transistor, a seventh switch transistor and a first capacitor.

A gate of the fourth switch transistor is connected with a first scanning signal end, a first electrode of the fourth switch transistor is connected with the gate of the driving transistor, and a second electrode of the fourth switch transistor is connected with the drain electrode of the driving transistor.

A gate of the fifth switch transistor is connected with a second scanning signal end, a first electrode of the fifth switch transistor is connected with a data signal end, and a second electrode of the fifth switch transistor is connected with a first electrode of the first capacitor.

A second electrode of the first capacitor is connected with the gate of the driving transistor.

A gate of the sixth switch transistor is connected with the first light emission control end, a first electrode of the sixth switch transistor is connected with a reference signal end, and a second electrode of the sixth switch transistor is connected with the first electrode of the first capacitor.

A gate of the seventh switch transistor is connected with the second reset control end, a first electrode of the seventh switch transistor is connected with the reference signal end, and a second electrode of the seventh switch transistor is connected with the first electrode of the first capacitor.

Optionally, in the display panel provided by the embodiments of the present application, the display region further includes a plurality of first reset signal lines and a plurality of second reset signal lines.

Each of the first reset signal lines is in corresponding connection with the first reset signal ends of a row or a column of the pixel circuits.

Each of the second reset signal lines is in corresponding connection with the second reset signal ends of a row or a column of the pixel circuits.

Optionally, in the display panel provided by the embodiments of the present application, the frame region includes a driving chip as well as a first reset signal bus, a second reset signal bus, and a first power source voltage bus connected to the driving chip.

The plurality of first reset signal lines are connected with the first reset signal bus, the plurality of second reset signal lines are connected with the second reset signal bus, and the first power source voltage bus is connected with the first power source voltage ends of the pixel circuits.

Optionally, in the display panel provided by the embodiments of the present application, the frame region includes a driving chip as well as a first reset signal bus and a first power source voltage bus connected to the driving chip.

The plurality of first reset signal lines are connected with the first reset signal bus, and the plurality of second reset signal lines and the first power source voltage ends of the pixel circuits are connected to the first power source voltage bus.

DETAILED DESCRIPTION OF THE EMBODIMENTS

Figure 1:
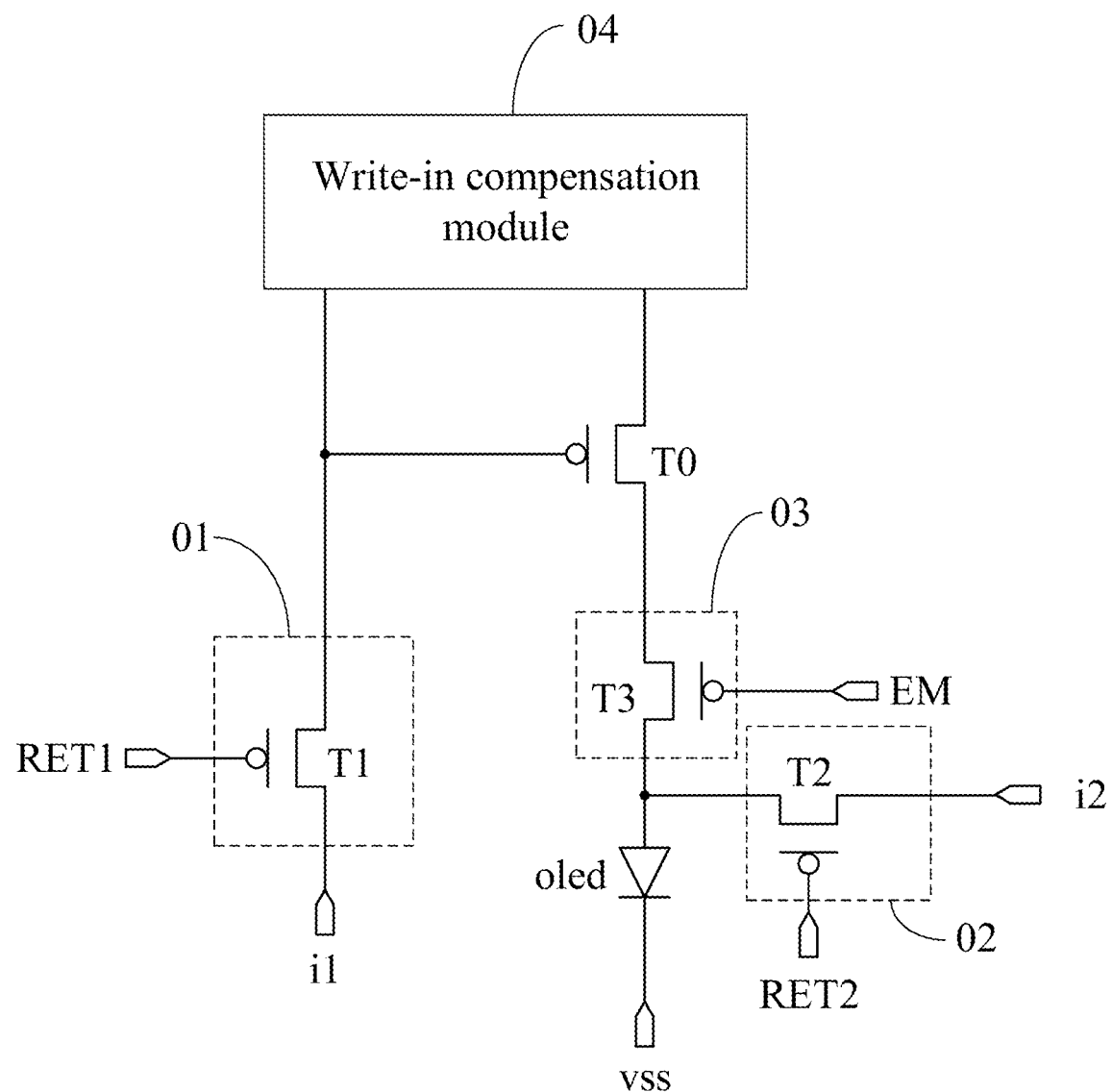
FIG. 1 is a schematic structural diagram of a pixel circuit provided by an embodiment of the present application.

In order to make the above objects, features and advantages of the present application more apparent and understandable, the present application will be further described below in conjunction with the accompanying drawings and embodiments. However, the embodiments can be implemented in various forms and should not be construed as limited to the embodiments set forth herein; rather, these embodiments are provided to make the present application more comprehensive and complete, and to convey the concept of the exemplary embodiments to those skilled in the art in their entirety. The same drawing reference numerals denote the same or similar structures in the figures, so repeated descriptions thereof will be omitted. The words used in the present application to express position and direction are all illustrated by taking the accompanying drawings as examples, but changes can be made as needed, and all changes are included in the scope of protection of the present application. The drawings of the present application are intended only to illustrate relative positional relationships and do not represent true proportions.

It should be noted that specific details are set forth in the following description to facilitate a full understanding of the present application. However, the present application can be practiced in a variety of other ways than those described herein, and those skilled in the art can make similar promotions without departing from the connotation of the present application. Therefore, the present application is not limited to the embodiments disclosed below. A follow description of the specification is intended to carry out the prefer embodiments of the present application, although the description is intended to illustrate the general principle of the present application and is not intended to limit the scope of the present application. The scope of protection of the present application shall be as defined in the attached claims.

Next, a pixel circuit and a display panel provided by embodiments of the present application will be described in detail in conjunction with the accompanying drawings.

A pixel circuit provided by embodiments of the present application, as shown in FIG. 1, includes: a first reset module 01, a second reset module 02, a driving transistor T0, a first light emission control module 03, a write-in compensation module 04 and a light emission device oled. The write-in compensation module 04 is configured to write data signals into the light emission device oled through the driving transistor T0 and compensate a threshold voltage of the driving transistor T0. The first reset module 01 is configured to provide a signal of a first reset signal end i1 to a gate of the driving transistor T0 under control of a first reset control end RET1. The second reset module 02 is configured to provide a signal of a second reset signal end i2 to an anode of the light emission device oled under control of a second reset control end RET2. The first light emission control module 03 is configured to connect a drain electrode of the driving transistor T0 to the anode of the light emission device oled under control of a first light emission control end EM. A cathode of the light emission device oled is connected with a first power source voltage end VSS. A potential of the first reset signal end i1 is larger than a potential of the second reset signal end i2.

According to the pixel circuit provided by the embodiments of the present application, the first reset module provides the signal of the first reset signal end to the gate of the driving transistor under control of the first reset control end, and resets the gate of the driving transistor through the signal of the first reset signal end. The second reset module provides the signal of the second reset signal end to the anode of the light emission device under control of the second reset control end, and resets the anode of the light emission device through the signal of the second reset signal end. Increasing of the potential of the first reset signal end can reduce leak currents at the gate of the driving transistor, and reducing of the potential of the second reset signal end can reduce leak currents flowing through the light emission device. Therefore, the potential of the first reset signal end is larger than the potential of the second reset signal end in the present application, so that leak currents of the pixel circuit can be reduced, screen flickering can be prevented, and display picture quality can be guaranteed.

Optionally, in the pixel circuit provided by embodiments of the present application, the potential of the first power source voltage end is the same as the potential of the second reset signal end i2. In this way, the leak currents flowing through the light emission device oled can be further reduced, and the display picture quality can be guaranteed.

Figure 7:
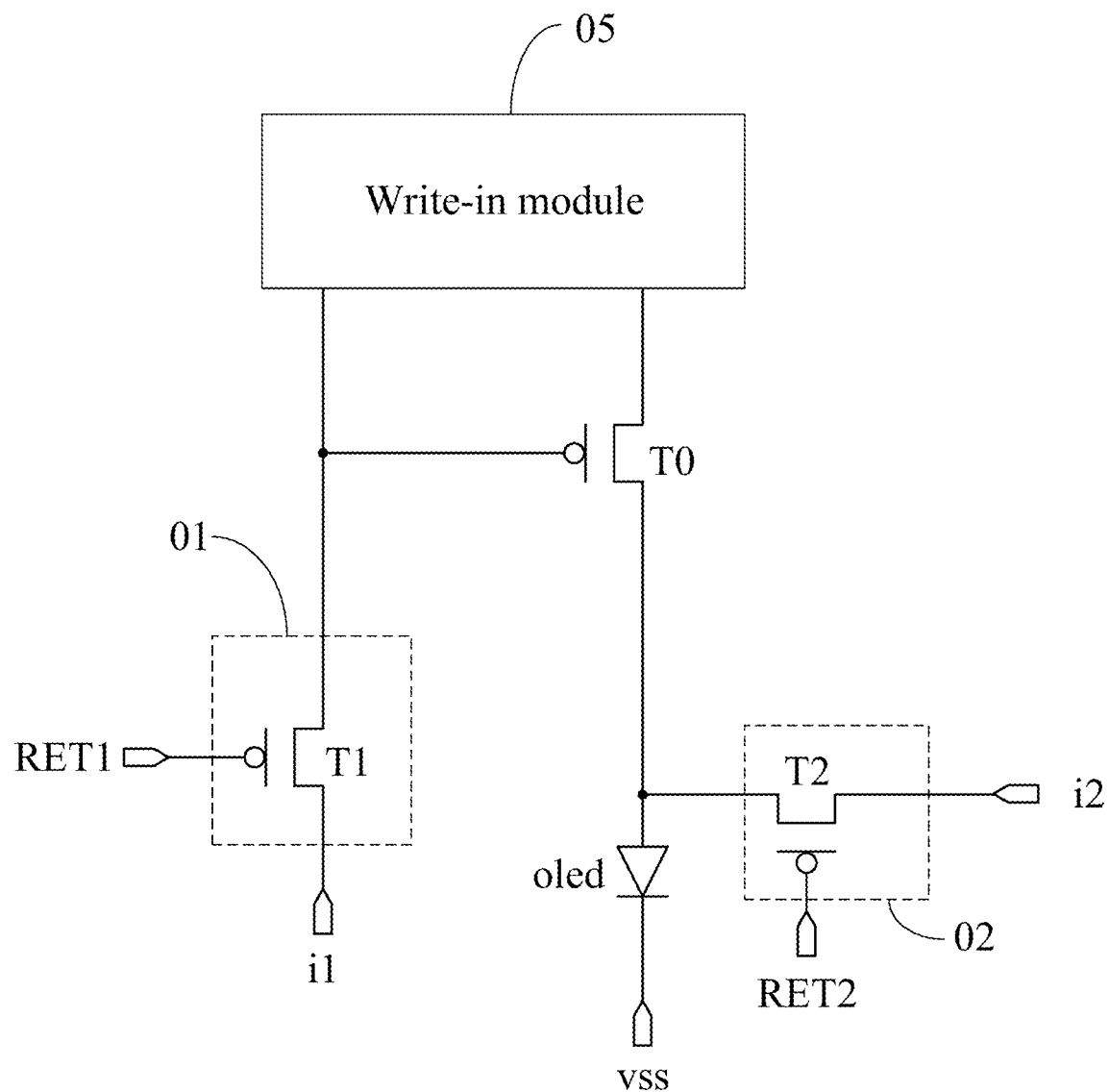
FIG. 7 is a schematic structural diagram of a pixel circuit provided by an embodiment of the present application.

It should be noted that the pixel circuit provided by the embodiments of the present application is applicable to any pixel circuit that needs to reset the driving transistor and the anode of the light emission device. The pixel circuit as shown in FIG. 7 includes a first reset module 01, a second reset module 02, a driving transistor T0, a write-in module 05 and a light emission device oled. The write-in module 05 is configured to write data signals into the light emission device oled through the driving transistor T0, but due to the process and device aging and other reasons, a threshold voltage of the driving transistor T0 of the pixel circuit will be non-uniform. Therefore, the pixel circuit of the present application, as shown in FIG. 1, can utilize the write-in compensation module 04 to write the data signals into the light emission device through the driving transistor, and compensate the threshold voltage of the driving transistor to avoid deviation of the threshold voltage of the driving transistor of the pixel circuit.

Optionally, in the pixel circuit provided by the embodiments of the present application, as shown in FIG. 1, the first reset module 01 includes a first switch transistor T1, a gate of the first switch transistor T1 is connected with the first reset control end RET1, a first electrode of the first switch transistor T1 is connected with the first reset signal end i1, and a second electrode of the first switch transistor T1 is connected with the gate of the driving transistor T0. The second reset module 02 includes a second switch transistor T2, a gate of the second switch transistor T2 is connected with the second reset control end RET2, a first electrode of the second switch transistor T2 is connected with the second reset signal end i2, and a second electrode of the second switch transistor T2 is connected with the anode of the light emission device oled. The first light emission control module 03 includes a third switch transistor T3, a gate of the third switch transistor gate T3 is connected with the first light emission control end EM, a first electrode of the third switch transistor T3 is connected with the drain electrode of the driving transistor T0, and a second electrode of the third switch transistor T3 is connected with the anode of the light emission device oled.

During specific implementation, the specific implementations of the write-in compensation module is not limited in the present application, and the pixel circuit provided by the embodiments of the present application is adapted to any pixel circuit having the first reset module and the second reset module. Next, the present application will be illustrated in detail with reference to the following embodiments. It should be noted that the object of the embodiment is to better explain the present application, rather than limiting the present application.

Figure 2:
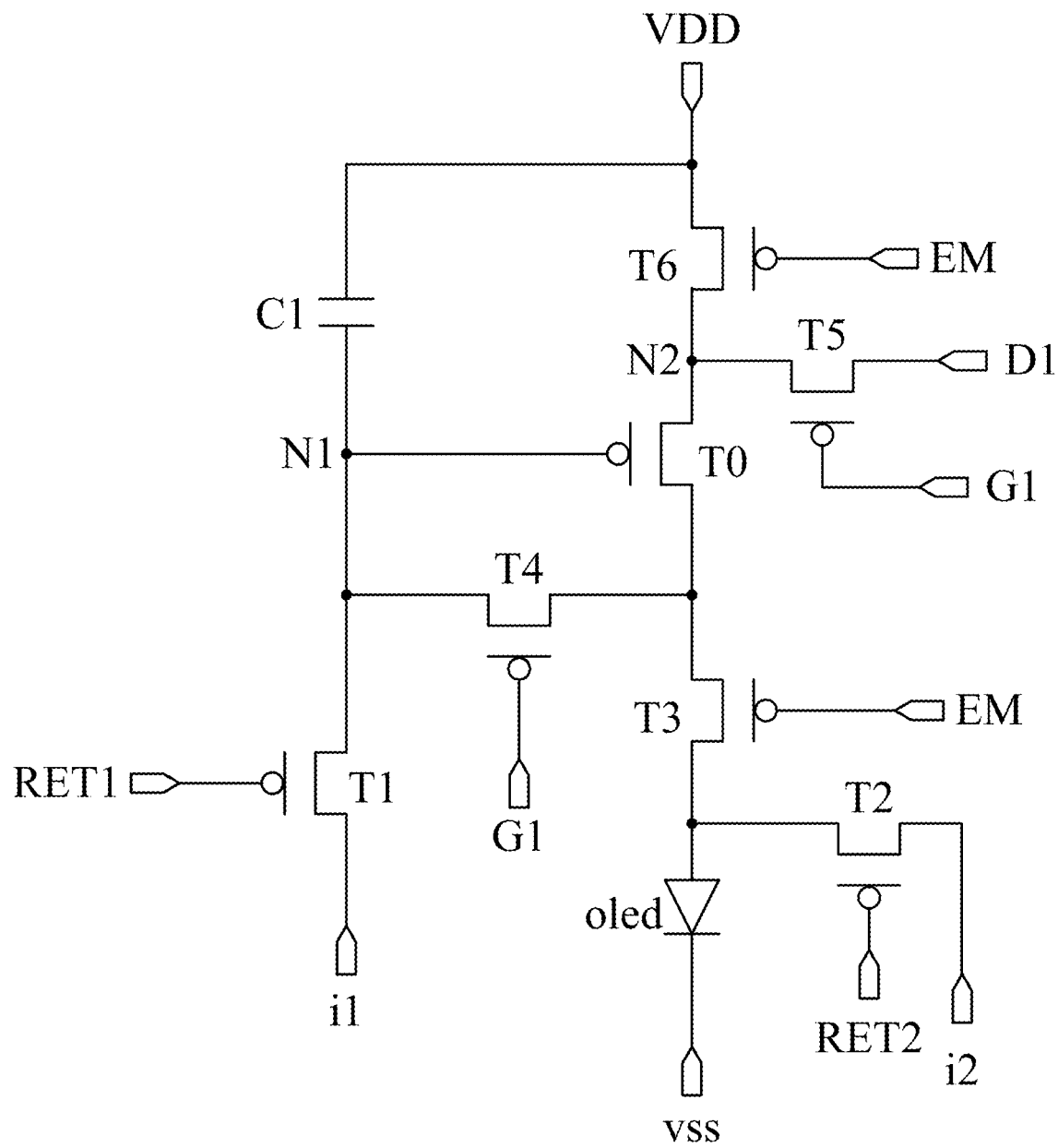
FIG. 2 is a schematic structural diagram of another pixel circuit provided by an embodiment of the present application.

In some embodiments, in the pixel circuit provided by the embodiments of the present application, as shown in FIG. 2, the write-in compensation module 04 includes: a fourth switch transistor T4, a fifth switch transistor T5, a sixth switch transistor T6 and a first capacitor C1. A gate of the fourth switch transistor T4 is connected with a scanning signal end G1, a first electrode of the fourth switch transistor T4 is connected with the gate of the driving transistor T0, and a second electrode of the fourth switch transistor T4 is connected with the drain electrode of the driving transistor T0. A gate of the fifth switch transistor T5 is connected with the scanning signal end G1, a first electrode of the fifth switch transistor T5 is connected with a data signal end D1, and a second electrode of the fifth switch transistor T5 is connected with a source electrode of the driving transistor T0. A gate of the sixth switch transistor T6 is connected with the first light emission control end EM, a first electrode of the sixth switch transistor T6 is connected with the source electrode of the driving transistor T0, and a second electrode of the sixth switch transistor T6 is connected with a second power source voltage end VDD. The first capacitor C1 is connected between the second power source voltage end VDD and the gate of the driving transistor T0.

Figure 5:
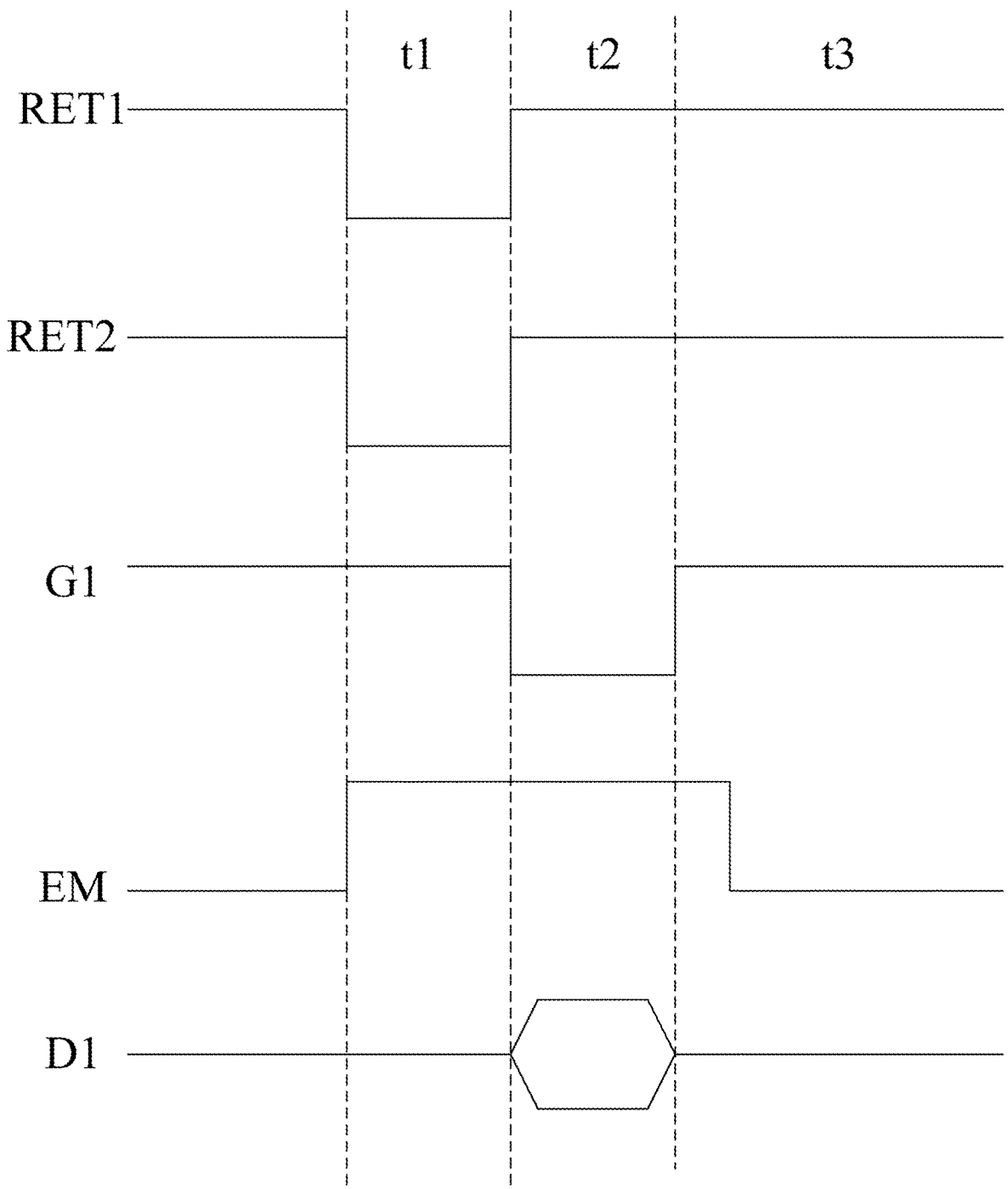
FIG. 5 is a sequence chart of a pixel circuit provided by an embodiment of the present application.

For example, a sequence chart corresponding to the above pixel circuit is as shown in FIG. 5. At a t1 stage, the first switch transistor T1 and the second switch transistor T2 are conducted, and a potential of an N1 node is Vi1 and the potential of the anode of the light emission device oled is VSS. In this stage, since the potential of the first power source voltage end VSS is the same as the potential of the second reset signal end i2, it is possible to reduce leak currents on the light emission device oled. At a t2 stage, the fourth switch transistor T4, the fifth switch transistor T5, and the driving transistor T0 are conducted, a potential of an N2 node is Vdata, and Vdata is written into the N1 node through the driving transistor T0 and the fourth switch transistor T4 until the potential of the N1 node turns into Vdata+Vth, and then the driving transistor T0 is cut off, Vth is a threshold voltage of the driving transistor T0. At a t3 stage, the third switch transistor T3 and the sixth switch transistor T6 are conducted, the potential of the N2 node is VSS, the potential of the N1 node is still Vdata+Vth, and the driving transistor T0 works in a saturated state. It can be known from the current characteristics of the saturated state, a working current $I_{oled}$ flowing through the driving transistor T0 and configured to drive the light emission device oled to emit light satisfies a formula: $I_{oled}=K(V_{gs}-Vth)^2=K[Vdata+Vth-V_{DD}-Vth]^2=K(Vdata-V_{DD})^2$, K is a structural parameter, the value is relatively stable in the same structure and can be counted as a constant. In this stage, since the potential of the first reset signal end i1 is relatively high, leak currents of the N1 node can be reduced.

Figure 3:
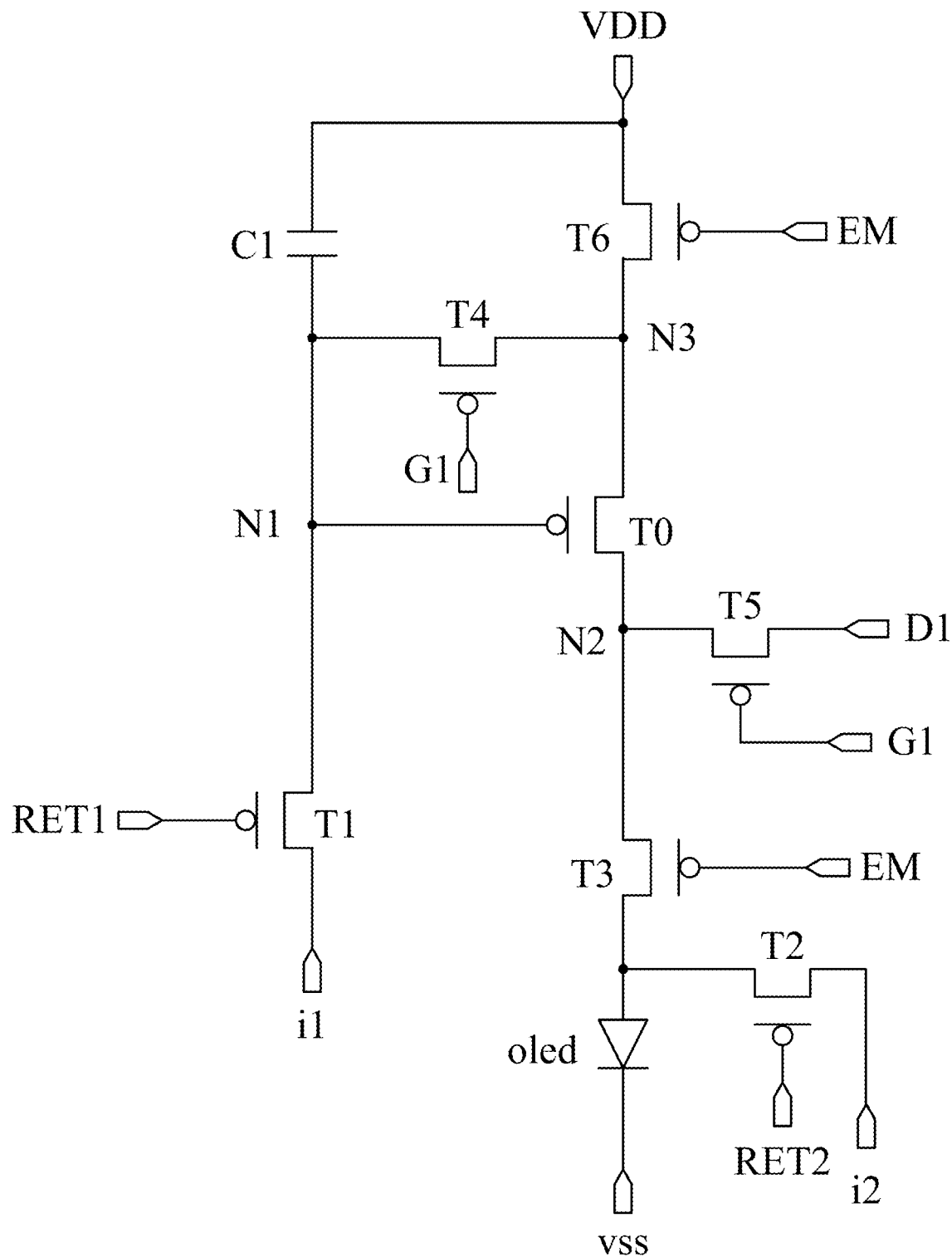
FIG. 3 is a schematic structural diagram of yet another pixel circuit provided by an embodiment of the present application.

In some other embodiments, in the pixel circuit provided by the embodiments of the present application, as shown in FIG. 3, the write-in compensation module 04 includes: a fourth switch transistor T4, a fifth switch transistor T5, a sixth switch transistor T6 and a first capacitor C1. A gate of the fourth switch transistor T4 is connected with a scanning signal end G1, a first electrode of the fourth switch transistor T4 is connected with the gate of the driving transistor T0, and a second electrode of the fourth switch transistor T4 is connected with a source electrode of the driving transistor T0. A gate of the fifth switch transistor T5 is connected with the scanning signal end G1, a first electrode of the fifth switch transistor T5 is connected with a data signal end D1, and a second electrode of the fifth switch transistor T5 is connected with the drain electrode of the driving transistor T0. A gate of the sixth switch transistor T6 is connected with the first light emission control end EM, a first electrode of the sixth switch transistor T6 is connected with the source electrode of the driving transistor T0, and a second electrode of the sixth switch transistor T6 is connected with a second power source voltage end VDD. The first capacitor C1 is connected between the second power source voltage end VDD and the gate of the driving transistor T0.

For example, the sequence chart corresponding to the above pixel circuit is as shown in FIG. 5. At the t1 stage, the first switch transistor T1 and the second switch transistor T2 are conducted, and the potential of the N1 node is Vi1 and the potential of the anode of the light emission device oled is VSS. In this stage, since the potential of the first power source voltage end VSS is the same as the potential of the second reset signal end i2, it is possible to reduce leak currents on the light emission device oled. At the t2 stage, the fourth switch transistor T4, the fifth switch transistor T5, and the driving transistor T0 are conducted, the potential of the N2 node is Vdata, and Vdata is written into the N1 node through the driving transistor T0 and the fourth switch transistor T4 until the potential of the N1 node turns into Vdata+Vth, and then the driving transistor T0 is cut off, Vth is a threshold voltage of the driving transistor T0. At the t3 stage, the third switch transistor T3 and the sixth switch transistor T6 are conducted, the potential of the N3 node is VDD, the potential of the N1 node is still Vdata+Vth, and the driving transistor T0 works in a saturated state. It can be known from the current characteristics of the saturated state, the working current $I_{oled}$ flowing through the driving transistor T0 and configured to drive the light emission device oled to emit light satisfies the formula: $I_{oled}=K(V_{gs}-Vth)^2=K[Vdata+Vth-V_{DD}-Vth]^2=K(Vdata-V_{DD})^2$, K is a structural parameter, the value is relatively stable in the same structure and can be counted as a constant. In this stage, since the potential of the first reset signal end i1 is relatively high, leak currents of the N1 node can be reduced.

Figure 4:
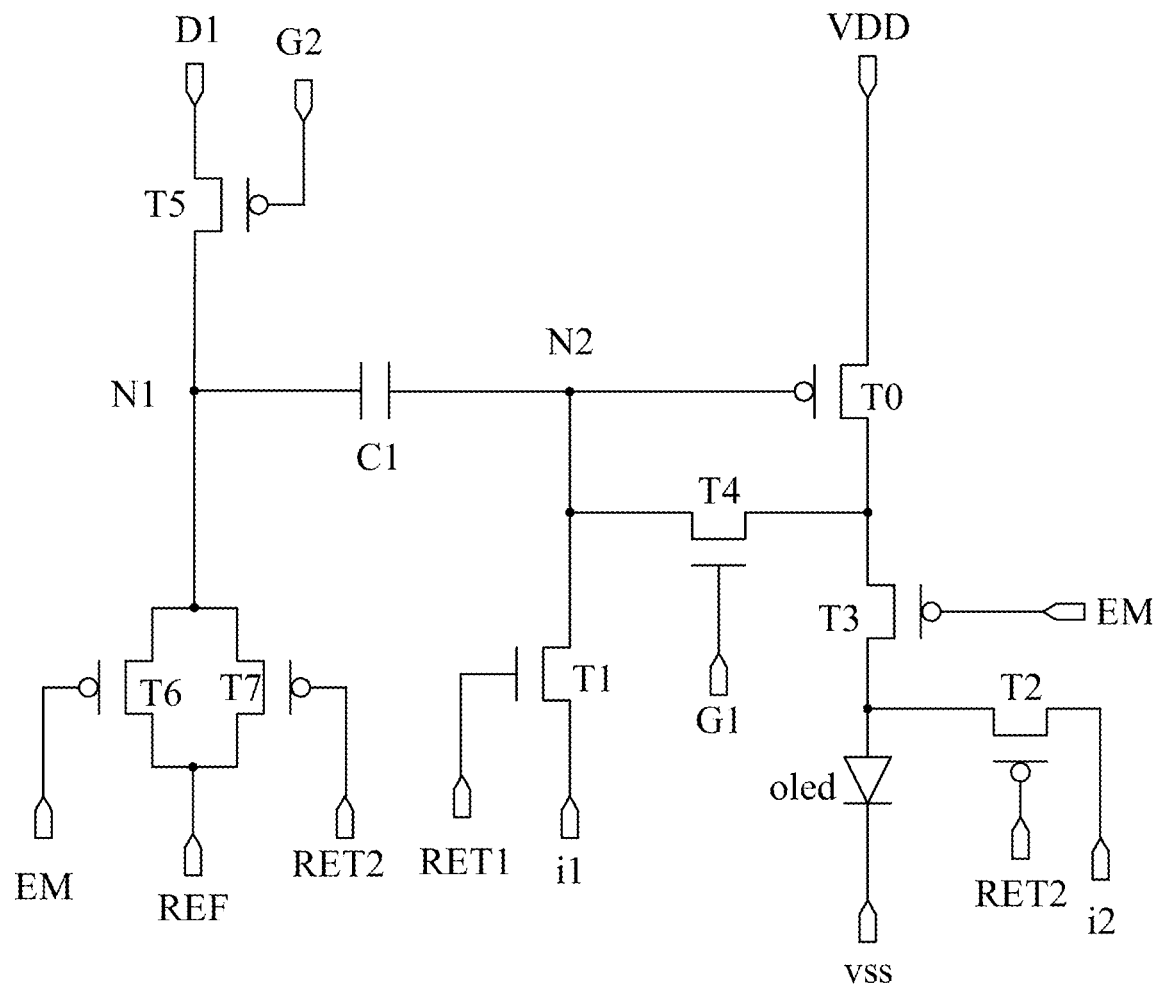
FIG. 4 is a schematic structural diagram of yet another pixel circuit provided by an embodiment of the present application.

In further embodiments, in the pixel circuit provided by the embodiments of the present application, as shown in FIG. 4, the write-in compensation module 04 includes: a fourth switch transistor T4, a fifth switch transistor T5, a sixth switch transistor T6, a seventh switch transistor T7 and a first capacitor C1. A gate of the fourth switch transistor T4 is connected with a first scanning signal end G1, a first electrode of the fourth switch transistor T4 is connected with the gate of the driving transistor T0, and a second electrode of the fourth switch transistor T4 is connected with the drain electrode of the driving transistor T0. A gate of the fifth switch transistor T5 is connected with a second scanning signal end G2, a first electrode of the fifth switch transistor T5 is connected with a data signal end D1, and a second electrode of the fifth switch transistor T5 is connected with a first electrode of the first capacitor C1. A second electrode of the first capacitor C1 is connected with the gate of the driving transistor T0. A gate of the sixth switch transistor T6 is connected with the first light emission control end EM, a first electrode of the sixth switch transistor T6 is connected with a reference signal end REF, and a second electrode of the sixth switch transistor T6 is connected with the first electrode of the first capacitor C1. A gate of the seventh switch transistor T7 is connected with the second reset control end RET2, a first electrode of the seventh switch transistor T7 is connected with the reference signal end REF, and a second electrode of the seventh switch transistor T7 is connected with the first electrode of the first capacitor C1.

Figure 6:
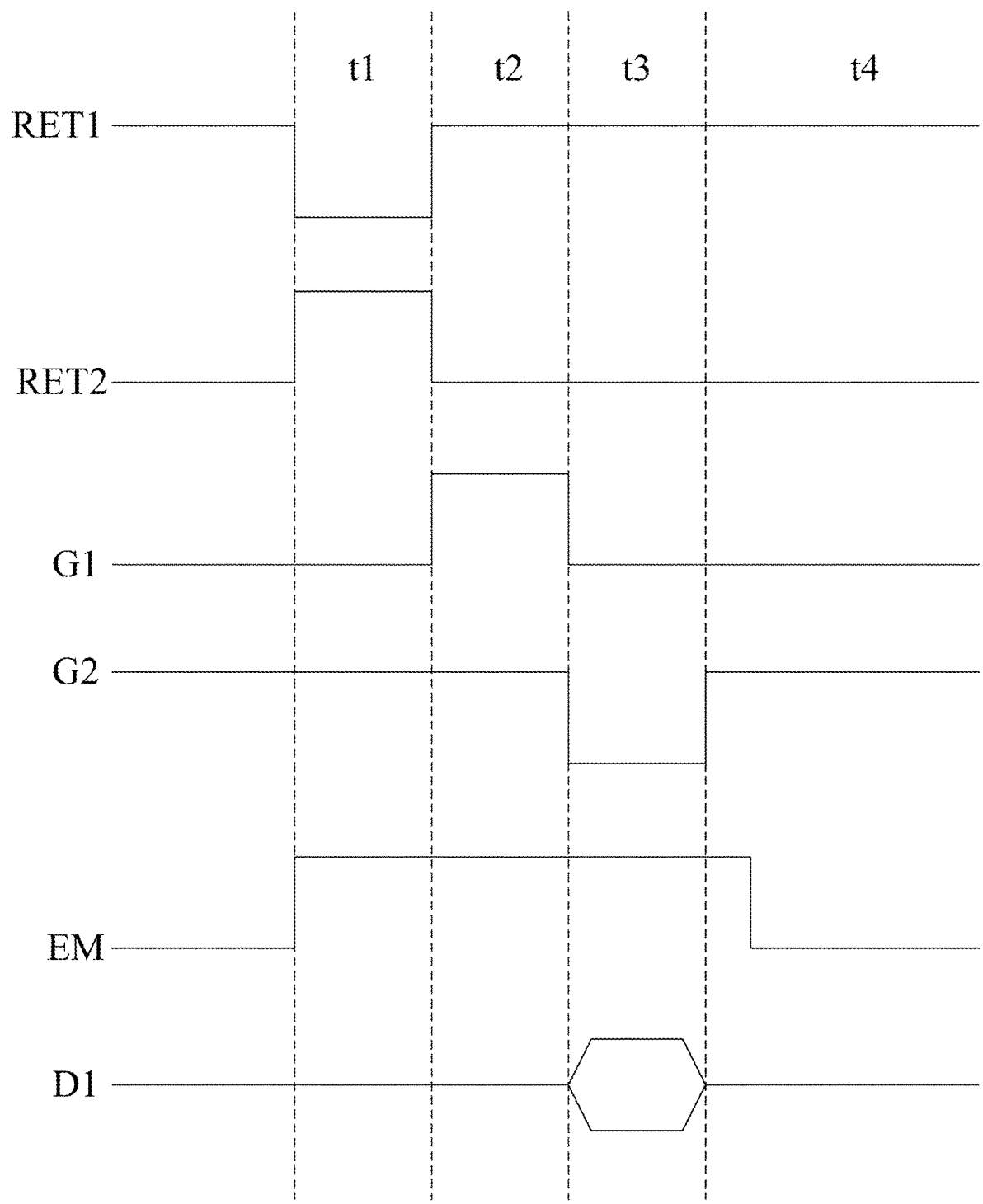
FIG. 6 is another sequence chart of the pixel circuit provided by an embodiment of the present application.

For example, a sequence chart corresponding to the above pixel circuit is as shown in FIG. 6. At a t1 stage, the first switch transistor T1, the second switch transistor T2 and the seventh switch transistor T7 are conducted, a potential of a N1 node is VREF, a potential of a N2 node is Vi1, and the potential of the anode of the light emission device oled is VSS. In this stage, since the potential of the first power source voltage end VSS is the same as the potential of the second reset signal end i2, it is possible to reduce leak currents on the light emission device oled. At a t2 stage, the fourth switch transistor T4 and the driving transistor T0 are conducted, VDD is written into the N2 node through the driving transistor T0 and the fourth switch transistor T4 until the potential of the N2 node turns into VDD+Vth, and then the driving transistor T0 is cut off, Vth is a threshold voltage of the driving transistor T0. At a t3 stage, the fifth switch transistor T5 is conducted, the potential of the N1 node is Vdata, and the potential of the N2 node turns into VDD+Vth+Vdata−VREF. At a t4 stage, the third switch transistor T3 and the sixth switch transistor T6 are conducted, the potential of the N1 node turns into VREF, the potential of the N2 node turns into VDD+Vth+Vdata−VREF, and the driving transistor T0 works in a saturated state. It can be known from the current characteristics of the saturated state, a working current Ioied flowing through the driving transistor T0 and configured to drive the light emission device oled to emit light satisfies a formula: $I_{oled}=K(V_{gs}-Vth)^2=K[VDD+Vth+Vdata-VREF-V_{DD}-Vth]^2=K(Vdata-VREF)^2$, K is a structural parameter, the value is relatively stable in the same structure and can be counted as a constant. In this stage, since the potential of the first reset signal end i1 is relatively high, leak currents of the N1 node can be reduced.

In at least one of the embodiments of the present disclosure, the voltage range of the first reset signal end i1 may be between −9V to −2V; and the voltage range of the second reset signal end i2 may be between −10V to −2.1V. For example, the voltage of i1 is −8V, −7V, −6V, −5V, −4V, −3V, etc.; and the voltage of the second reset signal end i2 is −9V, −8V, −7V, −6V, −5V, −4V, −3V, etc.

In at least one of the embodiments of the present disclosure, the voltage range of the first power source voltage end VSS is between −10V to −2.1V, which may be between −4V to −2.1V during specific implementation. For example, when the voltage of the second reset signal end i2 is between −4V to −2.1V, the same potential as the first power source voltage end VSS may be connected. In this way, the signal of the second reset signal end i2 may be provided by a first power source voltage end bus LVSS (a cathode potential line VSS) arranged around the display region, and the territory layout space can be optimized at this time.

In at least one of the embodiments of the present disclosure, the voltage of the first reset signal end i1 may be 0.5 to 3 times higher than the voltage of the second reset signal end i2, so that the occurrence of leak currents can be slowed down.

In at least one of the embodiments of the present disclosure, the voltage of the second reset signal end i2 may be lower than VSS, such that its absolute value is 0.5 to 2 times of VSS, so that the occurrence of leak currents can be slowed down.

It should be noted that the driving transistor and the switch transistor mentioned in the embodiments of the present application may be thin film transistors (TFT) or metal oxide semiconductor (MOS) field effect transistors, which are not limited herein.

Optionally, in the above pixel circuit provided by the embodiments of the present application, the transistor may be a P-type transistor or an N-type transistor, which is not limited herein.

Figure 8:
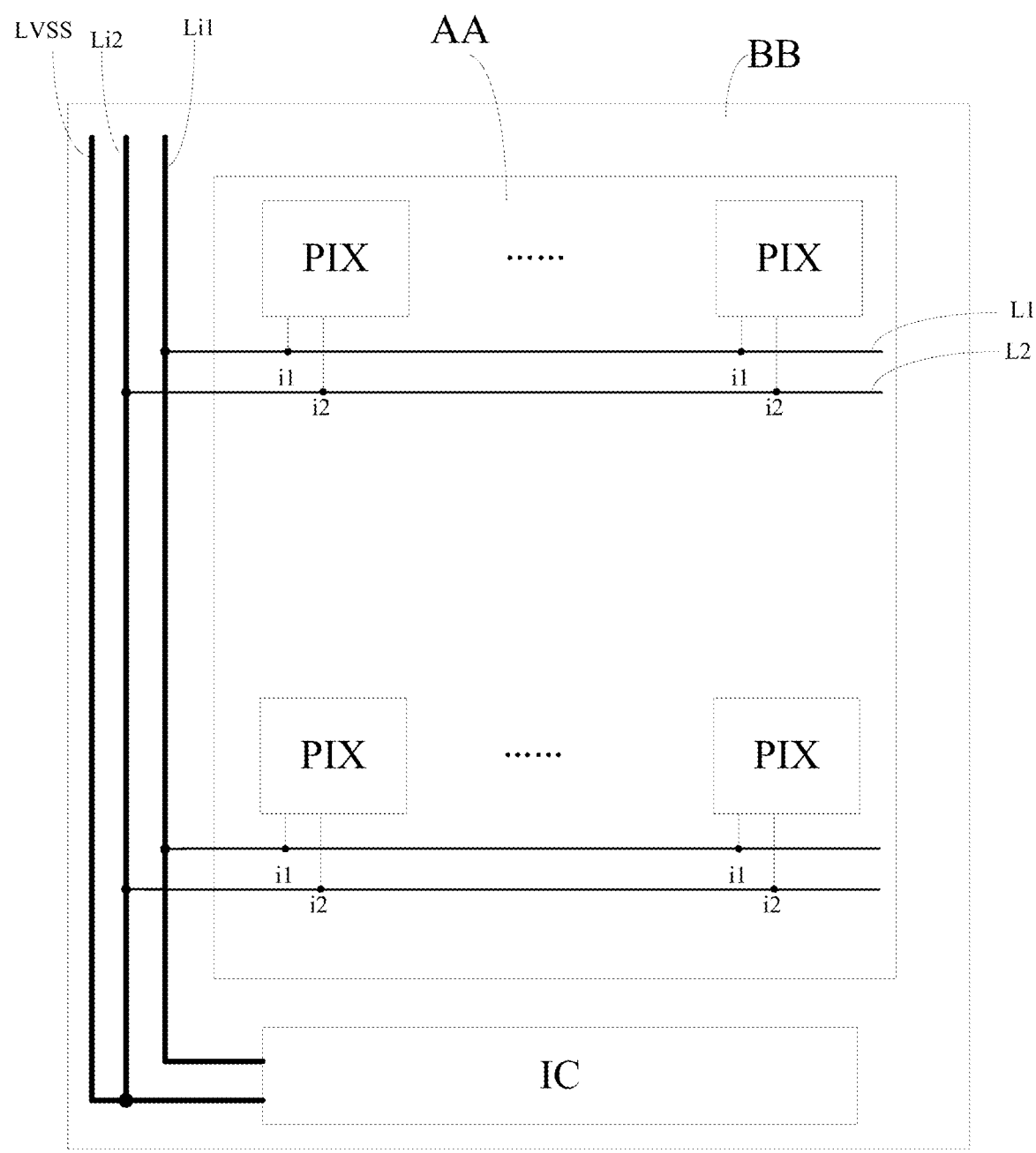
FIG. 8 is a schematic structural diagram of a display panel provided by an embodiment of the present application.
Figure 9:
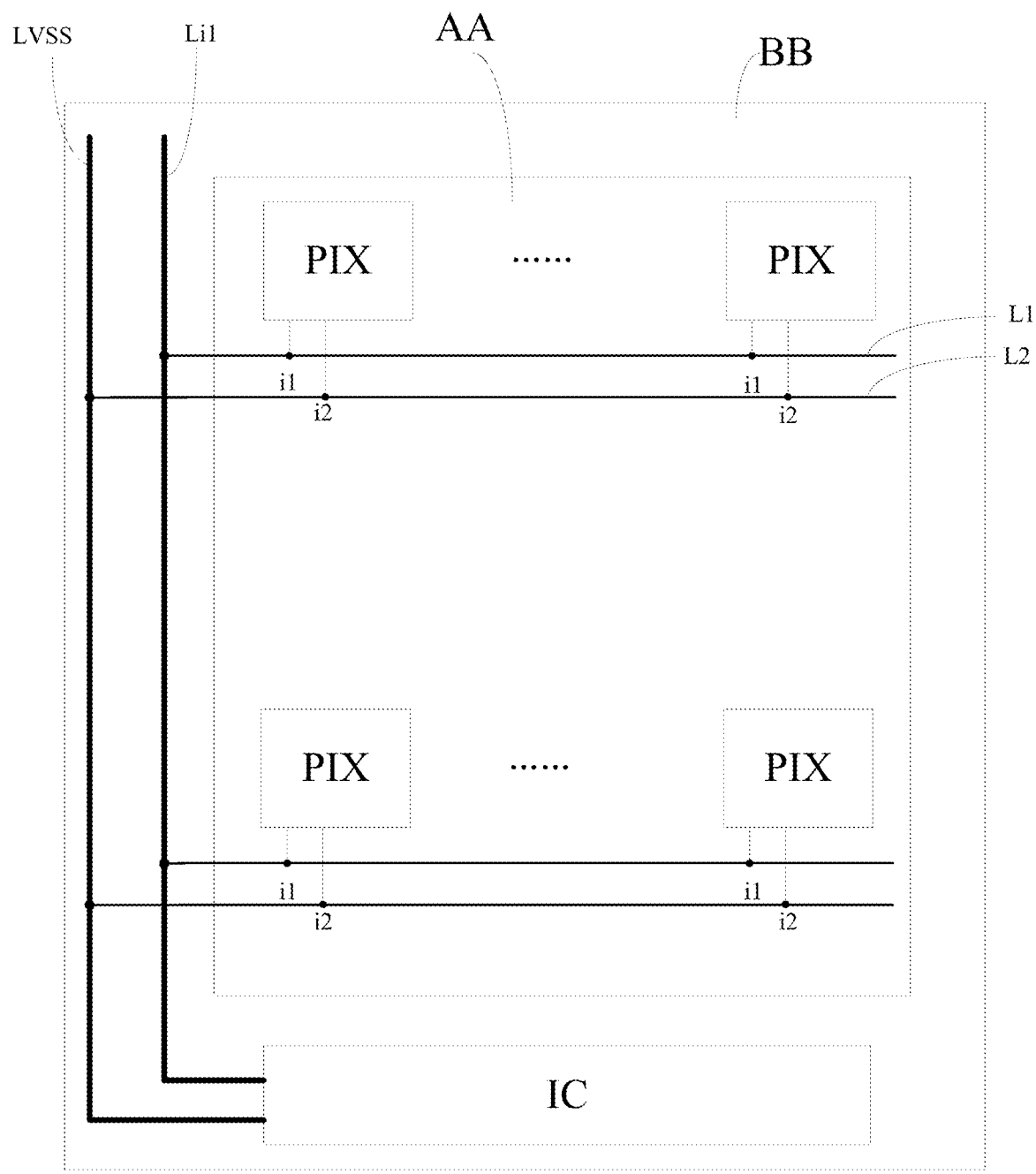
FIG. 9 is a schematic structural diagram of another display panel provided by an embodiment of the present application.

Based on the same inventive concept, embodiments of the present application further provide a display panel, as shown in FIG. 8 and FIG. 9. The display panel includes a display region AA and a frame region BB. The display region AA includes a plurality of pixel circuits PIX in matrix arrangement, and the pixel circuits PIX are any of the pixel circuits PIX provided by the embodiments of the present application. Since the principle of solving the problem of the display panel is similar to that of the pixel circuit, the implementation of the liquid display panel can take reference to the implementation of the pixel circuit, so that repeated contents will not be repeated here.

Optionally, in the display panel provided by the embodiments of the present application, as shown in FIG. 8 and FIG. 9, the display region AA further includes a plurality of first reset signal lines L1 and a plurality of second reset signal lines L2.

Each of the first reset signal lines L1 is in corresponding connection with the first reset signal ends i1 of a row or a column of the pixel circuits.

Each of the second reset signal lines L2 is in corresponding connection with the second reset signal ends i2 of a row or a column of the pixel circuits.

Optionally, in the display panel provided by the embodiments of the present application, as shown in FIG. 8, the frame region BB includes a driving chip IC as well as a first reset signal bus Li1, a second reset signal bus Li2, and a first power source voltage bus LVSS connected to the driving chip IC. The plurality of first reset signal lines L1 are connected to the first reset signal bus Li1, the plurality of second reset signal lines L2 are connected to the second reset signal bus Li2, and the first power source voltage bus LVSS is connected with the first power source voltage ends (not shown in the figure) of the pixel circuits PIX. In this way, compared with existing display panels, the design difficulty is lower and modifications are fewer.

Optionally, the first reset signal bus Li1 and/or the first power source voltage bus LVSS may be disposed around the AA region, so that signals in the active display region AA are uniform.

Alternatively, optionally, in the display panel provided by the embodiments of the present application, as shown in FIG. 9, the frame region BB includes a driving chip IC as well as a first reset signal bus Li1 and a first power source voltage bus LVSS connected to the driving chip IC. The plurality of first reset signal lines L1 are connected with the first reset signal bus Li1, the plurality of second reset signal lines L2 and the first power source voltage ends (not shown in the figure) of the pixel circuits PIX are connected with the first power source voltage bus LVSS. In this way, the quantity of traveling lines in the frame region can be reduced, which is beneficial for narrow frame design.

During specific implementation, the light emission devices of all the pixel circuits in the display panel share a cathode layer, and the cathode layer is connected with the first power source voltage bus, thereby realizing connection between the first power source voltage bus and the first power source voltage end of each pixel circuit.

Figure 10:
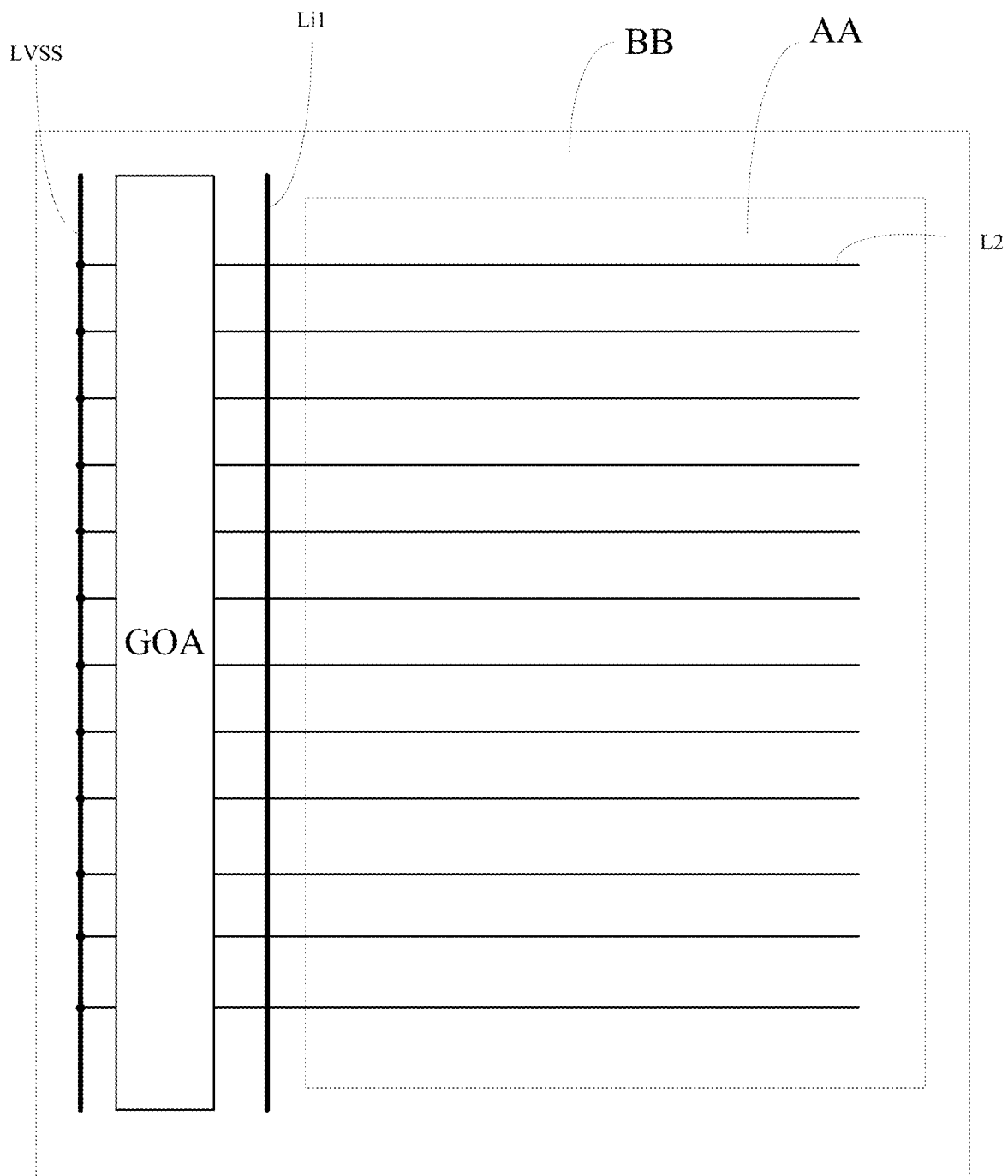
FIG. 10 is a schematic structural diagram of yet another display panel provided by an embodiment of the present application.
Figure 11:
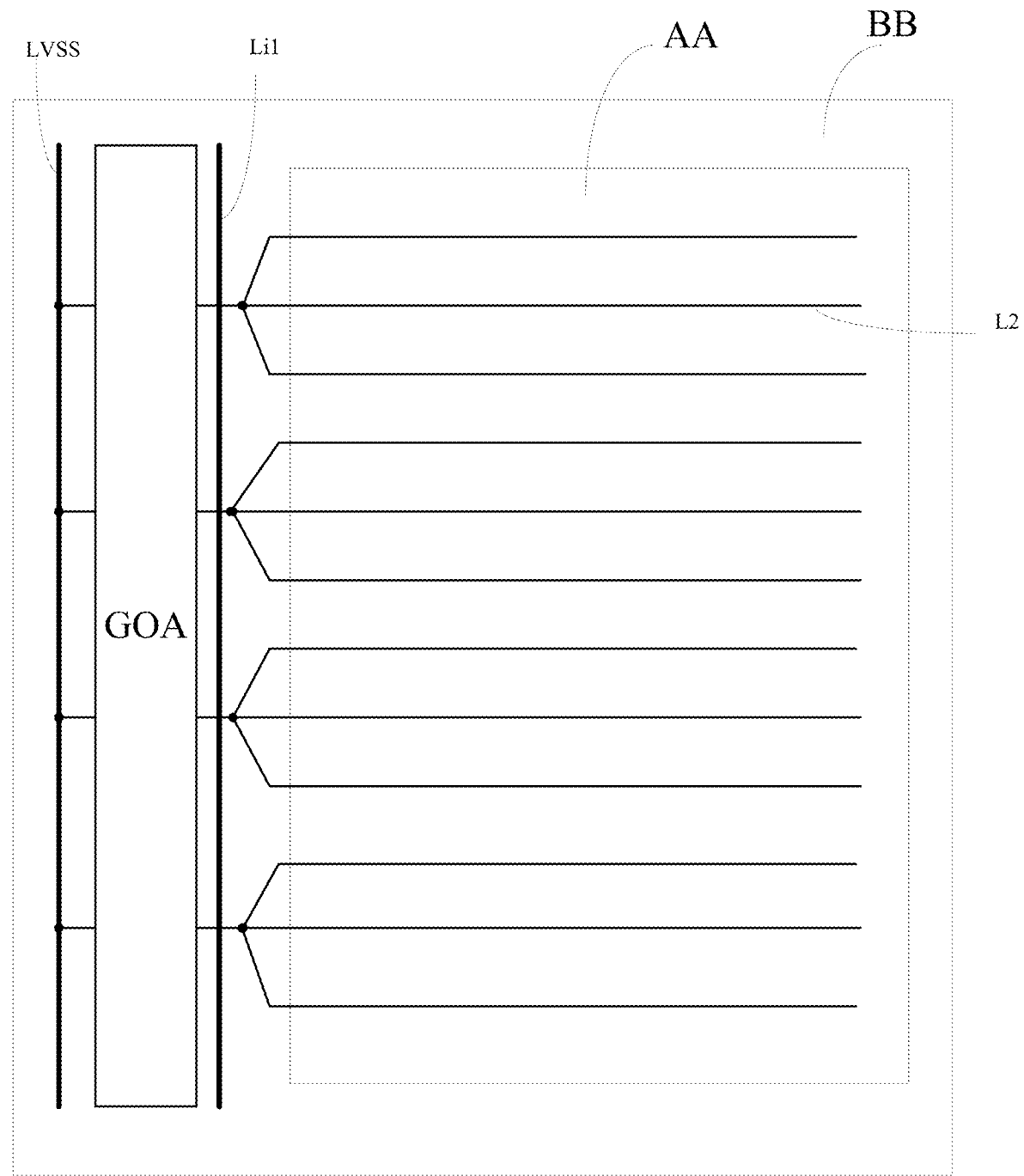
FIG. 11 is a schematic structural diagram of yet another display panel provided by an embodiment of the present application.

During specific implementation, in the display panel provided by the embodiments of the present application, as shown in FIG. 10 and FIG. 11, when the frame region BB is not provided with the second reset signal bus Li2, that is, when the frame region BB is only provided with the first reset signal bus Li1 and the first power source voltage bus LVSS, as shown in FIG. 10, each second reset signal line L2 may be respectively connected with the first power source voltage bus LVSS, or as shown in FIG. 11, multiple second reset signal lines L2 may be connected to one traveling line and then connected with the first power source voltage bus LVSS.

During specific implementation, in the display panel provided by the embodiments of the present application, as shown in FIG. 10 and FIG. 11, the frame region BB is generally further provided with a gate driving circuit GOA. The gate driving circuit GOA is configured to control the gate of each switch transistor of each pixel circuit in the display region AA. The first power source voltage bus LVSS is arranged on the side of the gate driving circuit GOA away from the display region AA. The second reset signal lines L2 in the display region AA can be connected to the first power source voltage bus LVSS through a jumper design as shown in FIG. 10, or as shown in FIG. 11, multiple second reset signal lines L2 can also be connected to one traveling line and then connected to the first power source voltage bus LVSS by winding around the gate driving circuit GOA in a winding way.

Figure 12:
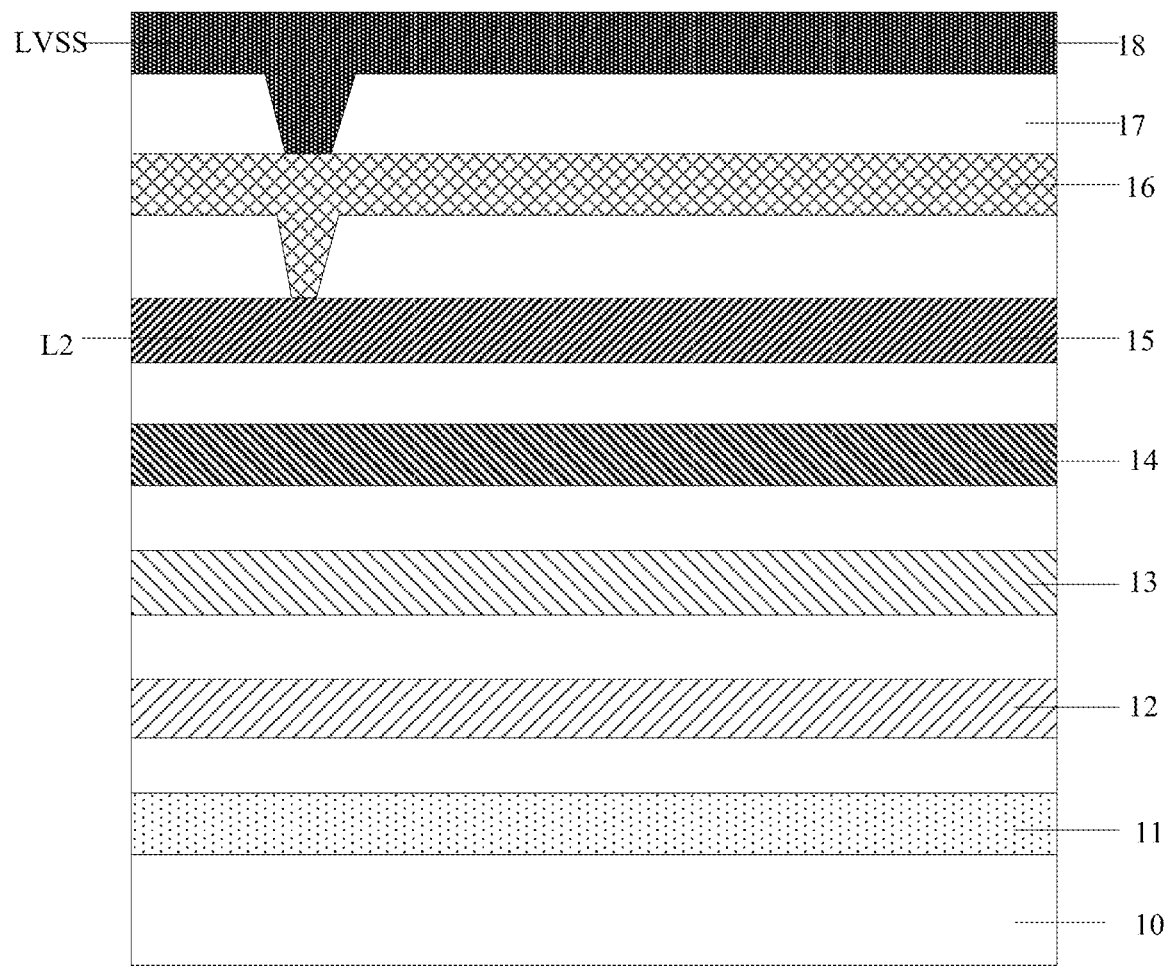
FIG. 12 is a schematic structural diagram of yet another display panel provided by an embodiment of the present application.
Figure 13:
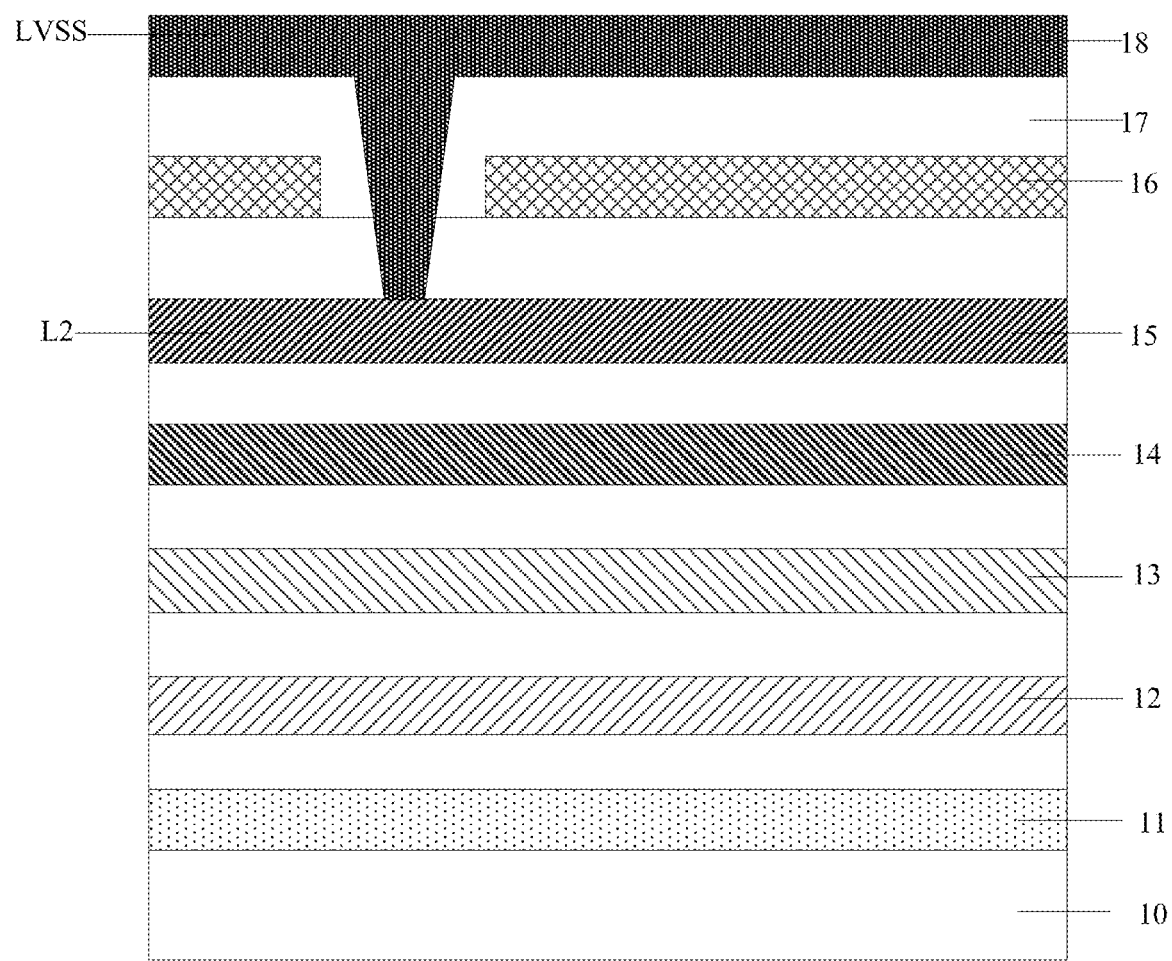
FIG. 13 is a schematic structural diagram of yet another display panel provided by an embodiment of the present application.

During specific implementation, the display panel provided by the present application, as shown in FIG. 12 and FIG. 13, generally includes a substrate baseplate 10, an active layer (Poly layer) 11 located on the substrate baseplate 10, a first gate layer (Gate1) 12, a second gate layer (Gate2) 13, a first source-drain layer (SD1) 14, a second source-drain layer (SD2) 15, a anode layer (Anode) 16, a pixel defining layer (PDL) 17, a light emission layer (not shown in the figures), and a cathode layer (Cathode) 18. The gate of the switch transistor in the pixel circuit is generally disposed in the first gate layer 12, a memory electrode is disposed in the second gate layer 13, and the memory electrode and the gate of the driving transistor constitute the first capacitor of the pixel circuit. The source-drain electrodes of the switch transistor are generally disposed in the first source-drain layer 14, the second power source voltage line (not shown in the figure) connected with the second power source voltage end is generally disposed in the second source-drain layer 15, and the first power source voltage bus LVSS located in the frame region BB is generally disposed in the cathode layer 18.

During specific implementation, as shown in FIG. 12, the second reset signal lines L2 may be connected to the first power source voltage bus LVSS through the anode layer 16. Alternatively, as shown in FIG. 13, the second reset signal lines L2 are connected to the first power source voltage bus LVSS by a via hole penetrating through the anode layer 16 and the pixel defining layer 17.

The present application only explains the pixel circuit and the display panel provided by the present application by using the embodiments, and is not limited thereto. According to the pixel circuit and the display panel provided by the embodiments of the present application, the first reset module provides the signal of the first reset signal end to the gate of the driving transistor under control of the first reset control end, and resets the gate of the driving transistor through the signal of the first reset signal end. The second reset module provides the signal of the second reset signal end to the anode of the light emission device under control of the second reset control end, and resets the anode of the light emission device through the signal of the second reset signal end. Increasing of the potential of the first reset signal end can reduce leak currents at the gate of the driving transistor, and reducing of the potential of the second reset signal end can reduce leak currents flowing through the light emission device. Therefore, the potential of the first reset signal end is larger than the potential of the second reset signal end in the present application, so that leak currents of the pixel circuit can be reduced, screen flickering can be prevented, and display picture quality can be guaranteed.

It will be apparent that various changes and variations may be made by those skilled in the art to the present application without departing from the spirit and scope of the present application. Thus, to the extent that these modifications and variations of the present application fall within the scope of the claims and their equivalents, the present application is also intended to include such modifications and variations.

What is claimed is:
1. A display panel, provided with:
a display region; and
a frame region;
wherein the display region comprises a plurality of pixel circuits in matrix arrangement;
wherein each of the pixel circuits comprises:
a first reset circuit, a second reset circuit, a driving transistor, a first light emission control circuit, a write-in compensation circuit and a light emission device, wherein:
the write-in compensation circuit is configured to write a data signal into the light emission device through the driving transistor and compensate a threshold voltage of the driving transistor;
the first reset circuit is configured to provide a signal of a first reset signal end to a gate of the driving transistor under control of a first reset control end;
the second reset circuit is configured to provide a signal of a second reset signal end to an anode of the light emission device under control of a second reset control end;
the first light emission control circuit is configured to connect a drain electrode of the driving transistor with the anode of the light emission device under control of a first light emission control end; and
a cathode of the light emission device is connected with a first power source voltage end;
wherein the display region further comprises:
a plurality of first reset signal lines; and
a plurality of second reset signal lines; wherein:
each of the first reset signal lines is in corresponding connection with the first reset signal ends of a row or a column of the pixel circuits; and
each of the second reset signal lines is in corresponding connection with the second reset signal ends of a row or a column of the pixel circuits;
wherein the frame region comprises:
a first reset signal bus, a second reset signal bus, and a first power source voltage bus;
wherein the plurality of first reset signal lines are connected with the first reset signal bus, the plurality of second reset signal lines are connected with the second reset signal bus, and the first power source voltage bus is connected with the first power source voltage ends of the pixel circuits;
wherein the display panel further comprises:
a base substrate;
an active layer on the base substrate;
a first gate layer on a side, facing away the base substrate, of the active layer;
a second gate layer on a side, facing away the active layer, of the first gate layer;
a first source-drain layer on a side, facing away the first gate layer, of the second gate layer;
a second source-drain layer on a side, facing away the second gate layer, of the first source-drain layer;
an anode layer on a side, facing away the first source-drain layer, of the second source-drain layer;
a pixel defining layer on a side, facing away the second source-drain layer, of the anode layer;
a light emission layer on a side, facing away the anode layer, of the pixel defining layer; and
a cathode layer on a side, facing away the pixel defining layer, of the light emission layer;
wherein gates of switch transistors in the pixel circuits are disposed in the first gate layer;
source-drain electrodes of switch transistors in the pixel circuits are disposed in the first source-drain layer;
the light emission devices in the pixel circuits are disposed in the cathode layer; and
the first power source voltage bus is disposed in the cathode layer;
wherein the second reset signal bus is on the second source-drain layer.

2. The display panel according to claim 1, wherein a potential of the first power source voltage end is same as the potential of the second reset signal end.

3. The display panel according to claim 2, wherein:
the first reset circuit comprises a first switch transistor, a gate of the first switch transistor is connected with the first reset control end, a first electrode of the first switch transistor is connected with the first reset signal end, and a second electrode of the first switch transistor is connected with the gate of the driving transistor;

the second reset circuit comprises a second switch transistor, a gate of the second switch transistor is connected with the second reset control end, a first electrode of the second switch transistor is connected with the second reset signal end, and a second electrode of the second switch transistor is connected with the anode of the light emission device; and the first light emission control circuit comprises a third switch transistor, a gate of the third switch transistor is connected with the first light emission control end, a first electrode of the third switch transistor is connected with the drain electrode of the driving transistor, and a second electrode of the third switch transistor is connected with the anode of the light emission device.

4. The display panel according to claim 1, wherein:

the first reset circuit comprises a first switch transistor, a gate of the first switch transistor is connected with the first reset control end, a first electrode of the first switch transistor is connected with the first reset signal end, and a second electrode of the first switch transistor is connected with the gate of the driving transistor;

the second reset circuit comprises a second switch transistor, a gate of the second switch transistor is connected with the second reset control end, a first electrode of the second switch transistor is connected with the second reset signal end, and a second electrode of the second switch transistor is connected with the anode of the light emission device; and the first light emission control circuit comprises a third switch transistor, a gate of the third switch transistor is connected with the first light emission control end, a first electrode of the third switch transistor is connected with the drain electrode of the driving transistor, and a second electrode of the third switch transistor is connected with the anode of the light emission device.

5. The display panel according to claim 1, wherein the write-in compensation circuit comprises: a fourth switch transistor, a fifth switch transistor, a sixth switch transistor and a first capacitor;

a gate of the fourth switch transistor is connected with a scanning signal end, a first electrode of the fourth switch transistor is connected with the gate of the driving transistor, and a second electrode of the fourth switch transistor is connected with the drain electrode of the driving transistor;

a gate of the fifth switch transistor is connected with the scanning signal end, a first electrode of the fifth switch transistor is connected with a data signal end, and a second electrode of the fifth switch transistor is connected with a source electrode of the driving transistor;

a gate of the sixth switch transistor is connected with the first light emission control end, a first electrode of the sixth switch transistor is connected with the source electrode of the driving transistor, and a second electrode of the sixth switch transistor is connected with a second power source voltage end; and the first capacitor is connected between the second power source voltage end and the gate of the driving transistor.

6. The display panel according to claim 1, wherein the write-in compensation circuit comprises: a fourth switch transistor, a fifth switch transistor, a sixth switch transistor and a first capacitor;

a gate of the fourth switch transistor is connected with a scanning signal end, a first electrode of the fourth switch transistor is connected with the gate of the driving transistor, and a second electrode of the fourth switch transistor is connected with a source electrode of the driving transistor;

a gate of the fifth switch transistor is connected with the scanning signal end, a first electrode of the fifth switch transistor is connected with a data signal end, and a second electrode of the fifth switch transistor is connected with the drain electrode of the driving transistor;

a gate of the sixth switch transistor is connected with the first light emission control end, a first electrode of the sixth switch transistor is connected with the source electrode of the driving transistor, and a second electrode of the sixth switch transistor is connected with a second power source voltage end; and the first capacitor is connected between the second power source voltage end and the gate of the driving transistor.

7. The display panel according to claim 1, wherein the write-in compensation circuit comprise: a fourth switch transistor, a fifth switch transistor, a sixth switch transistor, a seventh switch transistor and a first capacitor;

a gate of the fourth switch transistor is connected with a first scanning signal end, a first electrode of the fourth switch transistor is connected with the gate of the driving transistor, and a second electrode of the fourth switch transistor is connected with the drain electrode of the driving transistor;

a gate of the fifth switch transistor is connected with a second scanning signal end, a first electrode of the fifth switch transistor is connected with a data signal end, and a second electrode of the fifth switch transistor is connected with a first electrode of the first capacitor;

a second electrode of the first capacitor is connected with the gate of the driving transistor;

a gate of the sixth switch transistor is connected with the first light emission control end, a first electrode of the sixth switch transistor is connected with a reference signal end, and a second electrode of the sixth switch transistor is connected with the first electrode of the first capacitor; and a gate of the seventh switch transistor is connected with the second reset control end, a first electrode of the seventh switch transistor is connected with the reference signal end, and a second electrode of the seventh switch transistor is connected with the first electrode of the first capacitor.

8. The display panel according to claim 1, wherein the first reset signal bus and/or the first power source voltage bus is disposed around the display region.

9. The display panel according to claim 1, wherein the frame region further comprises:

a gate driving circuit;

wherein the first power source voltage bus is arranged on a side, away from the display region, of the gate driving circuit.

10. The display panel according to claim 9, wherein:

the plurality of second reset signal lines are connected with the first power source voltage bus respectively through a jumper design; or at least two of the plurality of second reset signal lines are connected to a traveling line, and the traveling line is connected with the first power source voltage bus by winding around the gate driving circuit.

11. The display panel according to claim 1, wherein:

the plurality of second reset signal lines are connected with the first power source voltage bus respectively; or at least two of the plurality of second reset signal lines are connected to a traveling line, and the traveling line is connected with the first power source voltage bus.

12. The display panel according to claim 1, wherein:
the second reset signal lines are connected with the first power source voltage bus through the anode layer; or
the second reset signal lines are connected with the first power source voltage bus through a via hole penetrating through the anode layer and the pixel defining layer.

13. The display panel according to claim 1, wherein:
a memory electrode is disposed in the second gate layer; and
the memory electrode and the gate of the driving transistor constitutes a first capacitor in the write-in compensation circuit.

14. The display panel according to claim 1, wherein:
the potential of the first reset signal end is 0.5 to 3 times higher than the potential of the second reset signal end.

15. The display panel according to claim 1, wherein the potential of the second reset signal end is lower than a potential of the first power source voltage end.

16. The display panel according to claim 1, wherein the first reset signal bus, the second reset signal bus and the first power source voltage bus extend in a column direction of the display panel.

17. The display panel according to claim 1, wherein the second reset signal bus is electrically connected with the first power source voltage bus in the frame region.

18. The display panel according to claim 1, wherein a potential of the first reset signal end is larger than a potential of the second reset signal end.

* * * * *